United States Patent [19]
Henry

[11] Patent Number: 5,238,504
[45] Date of Patent: Aug. 24, 1993

[54] USE OF TERPENE HYDROCARBONS AND KETONE BLENDS FOR ELECTRICAL CONTACT CLEANING

[75] Inventor: Richard G. Henry, Mayfield Heights, Ohio

[73] Assignee: Advanced Research Technologies, Park Ridge, Ill.

[21] Appl. No.: 766,100

[22] Filed: Sep. 27, 1991

[51] Int. Cl.$^5$ .................. C11D 7/50; C23G 5/02
[52] U.S. Cl. ........................... 134/40; 134/42; 252/170; 252/DIG. 8
[58] Field of Search ............... 134/38, 40, 42; 252/170, DIG. 8

[56] References Cited

U.S. PATENT DOCUMENTS

| | | | |
|---|---|---|---|
| 4,576,738 | 3/1986 | Colodney et al. | 252/170 |
| 4,654,160 | 3/1987 | Wilson et al. | 252/170 |
| 4,867,800 | 9/1989 | Dishart et al. | 134/40 |
| 4,877,545 | 10/1989 | Merchant et al. | 252/170 |
| 4,934,391 | 6/1990 | Futch et al. | 134/40 |

*Primary Examiner*—Theodore Morris
*Assistant Examiner*—Saeed T. Chaudhry
*Attorney, Agent, or Firm*—Robert J. Black

[57] ABSTRACT

A blend of terpene hydrocarbons and aliphatic or cyclic ketones are used for the effective cleaning of electrical contacts. Such terpenes blended with ketone solvents have high dielectric strength, fast evaporation rate, and biodegradability making the proposed mixture an ideal substitute for the cleaning of electrical contacts in the electrical utility industry and for the cleaning of printed circuit boards in the electronics industry.

5 Claims, No Drawings

USE OF TERPENE HYDROCARBONS AND KETONE BLENDS FOR ELECTRICAL CONTACT CLEANING

BACKGROUND OF THE INVENTION

1. Field of the Invention

The present invention pertains to cleaning electrical contacts from traces of contaminants so that good contact can be made between electrically conducting surfaces. Particularly, it pertains to use of terpene hydrocarbons and ketone blends as an environmentally safer substitute for Freon 11 and Freon 13 for the cleaning of printed wiring circuit boards, etc.

2. Background Art

The electrical power industry has traditionally employed solvent based cleaning agents to remove traces of dirt and moisture from their equipment. In any electrical field it is very important that no contaminants remain behind on such contact surfaces because this can cause dangerous arcing and serious damage to both equipment and its operators. For this reason, for many years solvent based cleaners, such as 1,1,1 Trichloroethane have been utilized to perform such tasks. This material was frequently used because of its high dielectric strength and its very fast evaporation rate. However, because of its high toxicity and hazard to the environment, an alternative method is now deemed necessary. 1,1,1 Trichloroethane upon inhalation causes a drastic drop in blood pressure, can be the cause of unconsciousness and even death when inhaled in large amounts. This product is also known to cause damage to the kidneys, liver, spleen, and blood can occur when ingested.

On the other hand, Freon 11 and Freon 13 which are chlorofluorocarbons evaporate very quickly but are very destructive to the ozone layer of the atmosphere and thus are no longer considered acceptable because of their destructive effect on the environment.

Newly developed hydrochlorofluorocarbons liquids are ozone safe but contain chlorine and fluorine which are not safe to the water supplies and soil. For these reasons, as well as their extremely high cost, it makes them unacceptable for this use.

Many other solvents have also been tried as electrical contact cleaners and circuit board cleaners, such as isopropyl/acetone mixtures which are extremely flammable, and non-biodegradable thus making them unacceptable for use as a cleaning aid. Alcohols also may carry moisture into a system and cause corrosion problems. Alcohols also are not good at dissolving oils and thus do not clean well. Petroleum distillates such as mineral spirits do not evaporate quickly and in general are very flammable and therefore dangerous to use.

SUMMARY OF THE INVENTION

In the electrical power industry it is common practice to employ a solvent to remove moisture from "hot sticks" which are fiberglass probes used to check high voltage circuits for current flow. It has been determined that cyclohexanone is a solvent which is highly effective in removing moisture from surfaces because it has a 2.3% solubility in water and can remove such moisture leaving the "hot sticks" dry and safe for use. It has also been found that cyclohexanone is an extremely useful cleaner for home electrical meters which need to be cleaned with an appropriate drying solvent so as to make them ready for use again.

An important feature of the use of cyclohexanone is its relatively high flash point of 116 degrees Fahrenheit (open cup) and 141 degrees Fahrenheit (closed cup). While this is not as good as Freon or hydrochlorofluorocarbon solvents which are non-flammable, it is sufficiently good so as to allow for safe handling. Other non-halogenated solvents having flash points which are much lower, such as acetone-isopropyl alcohol mixtures which typically have flash points of −10 degrees Fahrenheit (open cup). Thus these solvents have been found unacceptable for safe usage. Cyclohexanone has an evaporation rate of 0.38 (while water is typically 1). With this fast evaporation rate for cyclohexanone, it is best for this application because too fast an evaporation rate will not be able to dissolve all contaminants. On the other hand, cyclohexanone evaporates leaving no residue behind, thus leaving the surface system completely clean and ready for use. See TABLE #1.

Cyclohexanone has a dielectric strength of 28 KV or 28,000 volts which makes it a safe solvent for use around electrical equipment. Because of this high value, it is unlikely a flashover will occur in most situations. In accordance with American Society for Testing Materials Standard D8577 a cell containing two disk electrodes was utilized. The solvents were run in triplicate. If the results varied by more than 2 KV, the test cell was cleaned and flushed with the contact cleaner product before retesting. See TABLE #2.

Because Dipentene is a natural product extracted from trees (a terpene), it is attackable by bacteria found in nature. Therefore, Dipentene may be considered as biodegradable within 28 days.

TABLE #1

| Product | Evaporation | Residue |
| --- | --- | --- |
| Hydrochlorofluorocarbon | Fast | None |
| Dipentene/ketone blend | Moderately Fast* | None |
| Naptha | Slow | None |
| alpha-phenanthrene | Slow | Trace |
| D-limonene | Slow | Trace |
| mineral spirits | Slow | None |
| 1,1,1 Trichloroethane | Fast | None |

Evaporation rates are judged as follows:
0–30 seconds   Very Fast
31–60 seconds   Fast
61–90 seconds   Moderately Fast   *Most desirable
91–150 seconds   Moderate
>150 seconds   Slow

TABLE #2

|  | Dielectric Strength ASTM D8577 |
| --- | --- |
| Hydrochlorofluorocarbon | 16 |
| Dipentene/ketone blend | 28 |
| Naptha | 18.5 |
| alpha-phenanthrene | 22.5 |
| D-limonene | 12 |
| mineral spirits | 21 |
| 1,1,1 Trichloroethane | 26 |

Corrosion tests have also determined that oxidation is a potential hazard of all contact cleaners. Tests with strips of copper and steel measuring 1" wide by 6" long by 20 mil thick were buffed on a belt sander to remove any oxide films. Fifty milliliters of solvent was placed in a cylindrical Pyrex glass container and the strips were placed in so that 75% of the surface was immersed in the solvent. A sample container filled with tap water was used as a control for test. This would ensure that there were no alloys in the metal strips that would prevent oxidation. The opening of the sample containers were sealed with cork stoppers to reduce evaporation. All of the solvents found tested in TABLES 1 and 2 were found to be non-corrosive.

Dipentene/ketone should be sprayed on copper and other conductive surfaces which may be found in electrical contacts on meters, cables, transformers, switches, relays and fiberglass "hot sticks". The solvent should then be allowed to evaporate leaving the surface clean and ready for use.

Effective removal of dust and spot free cleaning of circuit board and electronic components can be accomplished by using Dipentene/ketone as a cleaning aid. The Dipentene/ketone needs to be free of particulates and moisture before dipping or spraying printed circuit boards or electronic components. This can be accomplished by filtering the cyclohexanone through a 0.1 um millipore filter to remove any particulates which may cause contamination of electronic components. A standard cellulose drying filter which was pre-dried in an oven at 110 degrees Centigrade can be used to remove any moisture from the Dipentene/ketone blend.

The printed circuit boards should be sprayed or dipped into the Dipentene/ketone solvent and allowed to air dry for at least 15 minutes to allow all of the solvent to evaporate completely. A drying oven may also be used to force dry the solvent from the desired surface. A temperature of 60 degrees Centigrade is satisfactory to speed the drying process. The printed circuit board or electronic components cleaned in this process will now be free of dirt and moisture and ready for implementation. Blending ketones with other solvents such as Dipentene can reduce the cost of using ketones as an electrical contact cleaner.

DESCRIPTION OF THE PREFERRED EMBODIMENT

The present invention teaches a solvent selected from the terpene hydrocarbon and ketone group and with best results obtained Dipentene/methyl isoamyl ketone as a replacement for 1,1,1 trichloroethane and chlorofluorocarbon solvent as an electrical contact cleaner. To practice the invention, material may be utilized for proper cleaning of rubber gloves, fiberglass "hot sticks", electric meters, switches, relays, transformers, cables, and circuit boards. The material to be effective must have a 1-3% solubility in water, have a flashpoint of 118 degrees Fahrenheit (closed cup), and must not dissolve synthetic cable insulation. The solvent should also have a dielectric strength of at least 25,000 volts, and an evaporation rate of at least 0.40 (where water is employed as a standard at the rate of 1.0). The solvent must also evaporate completely, leaving behind no residue and contain no halogens.

Usage of the above described solvents would be similar to those described in the following when as an example to prevent arcing on rubber gloves it is considered to be desirable to prepare a 90:10 blend of Dipentene and methyl isoamyl ketone (MIAK), then carefully hold a pair of linemen's rubber gloves typically made of ethylene propylene diamine monomer, or EPDM) and pour the Dipentene/methyl isoamyl ketone mixture over their outside surface until they are completely covered with solvent. After this is completed, the solvent is allowed to evaporate completely, with the procedure repeated every 20 minutes as long as work is being performed on high voltage equipment.

Another example, to prevent arcing on fiberglass "hot sticks" used in checking high voltage circuits, a 90:10 blend of Dipentene and methyl isoamyl ketone is prepared with the solvent poured over a fiberglass "hot stick", pouring the solvent over the entire surface of the stick until it is soaked. After this the solvent is permitted to evaporate completely, the procedure being repeated every 20 minutes as long as work is being performed on high voltage equipment.

Another use for the present solvent includes the removal of grease from high voltage cables is facilitated by preparing the 90:10 blend of Dipentene and methyl isoamyl ketone, opening the insulation on the cable until the copper conductor is exposed. At this point the solvent blend is poured onto the exposed conductive surface, after which excessive cable grease is wiped off along with the solvent mixture with a clean rag until the surface is free of grease.

To clean transformer contacts of contaminants which may cause arcing is accomplished by again preparing a 90:10 blend of Dipentene and methyl isoamyl ketone. After this occurs, the cable is detached from the cable terminals, a generous amount of the solvent is sprayed onto the transformer terminals and onto the cable connectors. At the completion of this step, excess solvent is wiped off with a clean rag until the surfaces are clean of contaminants. After this, it is appropriate to reattach the clean cable connectors to transformer terminals. This procedure is repeated for electrical contacts on electric meters, switches, relays or other high voltage electrically conductive surfaces.

To clean printed circuit boards of dirt and other contaminants, again a 90:10 blend of Dipentene and methyl isoamyl ketone is mixed, after which the 90:10 blend is passed through a 0.1 micron filter to remove particulates. The circuit boards are then dipped into the solvent in a circulating chamber for 1-5 minutes. After this period, the circuit boards are removed from the solvent and the solvent is allowed to evaporate for about 15 minutes with the cleaned circuit boards being placed in an oven preheated to 60 degrees Centigrade for 5 minutes to speed evaporation of the solvent.

It should also be noted that other ketones, such as acetone, methyl ethyl ketone, methyl isobutyl ketone and cyclohexanone may also be used as a substitute for methyl isoamyl ketone in the above examples.

Other terpene hydrocarbons such as alpha-pinene, beta-pinene, nonal, octanal, para-menthadiene, para-cymene and turpentine may be used as a substitute for Dipentene in the above examples.

It should be noted that while several uses of the embodiments of the present invention have been shown, it will be obvious to those skilled in the art that numerous modifications to the processes disclosed herein may be made without departing from the spirit of the present invention which shall be limited only the scope of the claims appended hereto.

What is claimed is:

1. The process of cleaning rubber linemen's gloves comprising the steps of:
   preparing a 90:10 blend of Dipentene and methyl isoamyl ketone as a solvent;
   pouring said Dipentene and methyl isoamyl ketone blend over the outside surface of said gloves until they are complete coated with said solvent;
   allowing said solvent to evaporate from said surface;

removing any residue remaining on said glove surface by wiping after said evaporation step;

repeating said coating steps, said evaporation step and said residue removal step every 15-30 minutes as long as work is being performed on high voltage electrical equipment.

2. The process of cleaning "hot sticks" as utilized in checking high voltage circuits, comprising the steps of:

preparing a 90:10 blend of Dipentene and methyl isoamyl ketone as a solvent;

pouring said solvent blend over the entire surface of a hot stick, coating it until it is soaked;

repeating said coating step every 15-30 minutes as long work is being performed on high voltage equipment.

3. The process of removing grease from high voltage cables, comprising the steps of:

preparing a 90:10 blend of Dipentene and methyl isoamyl ketone as a solvent;

opening the insulation on said cable until an internal copper conductor is exposed;

coating said cable with said solvent;

allowing said solvent to evaporate from said surface;

wiping off excess cable grease, solvent and solvent blend until the surface is free of grease.

4. The process of cleaning transformer terminals of contaminants, comprising the steps of:

preparing a 90:10 blend of Dipentene and methyl isoamyl ketone as a solvent;

removing any cable from said transformer terminals;

coating said transformer terminals and any associated cable connectors with said solvent;

allowing said solvent to evaporate;

wiping residue from said transformer terminals and said cable connectors until said transformer terminals and said cable connectors are clean of contaminants.

5. The process as claimed in claim 4 wherein said procedures are repeated.

* * * * *